(12) United States Patent
Maeda et al.

(10) Patent No.: US 7,531,878 B2
(45) Date of Patent: *May 12, 2009

(54) SEMICONDUCTOR MIS TRANSISTOR FORMED ON SOI SEMICONDUCTOR SUBSTRATE

(75) Inventors: Shigenobu Maeda, Tokyo (JP); Shigeto Maegawa, Tokyo (JP); Takuji Matsumoto, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 149 days.

This patent is subject to a terminal disclaimer.

(21) Appl. No.: 11/610,932

(22) Filed: Dec. 14, 2006

(65) Prior Publication Data

US 2007/0087509 A1    Apr. 19, 2007

Related U.S. Application Data

(60) Division of application No. 11/061,645, filed on Feb. 22, 2005, now Pat. No. 7,164,172, which is a continuation of application No. 10/459,490, filed on Jun. 12, 2003, now Pat. No. 6,870,226.

(30) Foreign Application Priority Data

Oct. 17, 2002    (JP) .......................... P2002-302833

(51) Int. Cl.
  *H01L 27/01*   (2006.01)
  *H01L 27/12*   (2006.01)
  *H01L 31/0392* (2006.01)
(52) U.S. Cl. .................. 257/351; 257/350; 257/627; 257/E27.064; 257/E29.04
(58) Field of Classification Search .......... 257/350, 257/351, 627, E27.064, E29.04
See application file for complete search history.

(56) References Cited

U.S. PATENT DOCUMENTS 6,573,563 B2    6/2003   Lee et al.

(Continued)

FOREIGN PATENT DOCUMENTS

DE    199 62 053 A1    7/2000

(Continued)

OTHER PUBLICATIONS

S. Maeda, et al. IEEE, pp. 129-132, "Suppression of Delay Time Instability on Frequency Using Field Shield Isolation Technology for Deep Sub-Micron SOI Circuits", 1996.

(Continued)

*Primary Examiner*—Ngan Ngo
(74) *Attorney, Agent, or Firm*—Oblon, Spivak, McClelland, Maier & Neustadt, P.C.

(57) ABSTRACT

There is provided a semiconductor device which is formed on a semiconductor substrate and allows effective use of the feature of the semiconductor substrate, and there is also provided a method of manufacturing the same. An N-channel MOS transistor including a P-type body layer (3a), and a P-type active layer (6) for body voltage application which is in contact with the P-type body layer (3a) are formed on an SOI substrate which is formed to align a <110> crystal direction of a support substrate (1) with a <100> crystal direction of an SOI layer (3). A path connecting the P-type body layer (3a) and the P-type active layer (6) for body voltage application is aligned parallel to the <100> crystal direction of the SOI layer (3). Since hole mobility is higher in the <100> crystal direction, parasitic resistance (Ra, Rb) can be reduced in the above path. This speeds up voltage transmission to the P-type body layer (3a) and improves voltage fixing capability in the P-type body layer (3a).

6 Claims, 16 Drawing Sheets

U.S. PATENT DOCUMENTS

| | | |
|---|---|---|
| 6,753,555 B2 | 6/2004 | Takagi et al. |
| 6,870,226 B2 * | 3/2005 | Maeda et al. ............... 257/347 |
| 6,953,979 B1 | 10/2005 | Yamaguchi et al. |
| 7,164,172 B2 * | 1/2007 | Maeda et al. ............... 257/351 |
| 2003/0094674 A1 | 5/2003 | Ipposhi et al. |

FOREIGN PATENT DOCUMENTS

| | | |
|---|---|---|
| DE | 101 52 096 A1 | 6/2002 |
| DE | 101 43 256 A1 | 9/2002 |
| JP | 7-335511 | 12/1995 |
| JP | 8-97298 | 4/1996 |
| JP | 9-223667 | 8/1997 |
| JP | 2001-77368 | 3/2001 |
| JP | 2002-134374 | 5/2002 |
| JP | 2002-164520 | 6/2002 |

OTHER PUBLICATIONS

Y. Hirano, et al., IEEE International SOI Conference, pp. 131-132, "Bulk-Layout-Compatible 0.18 µm SOI-CMOS Technology Using Body-Fixed Partial Trench Isolation (PTI)"; Oct. 1999.

L.J. Huang, et al. Symposium on VLSI Technology Digest of technical Papers, pp. 57-58, Carrier Mobility Enhancement in Strained Si-On-Insulator Fabricated by Wafer Bonding, 2001.

* cited by examiner

F I G . 5
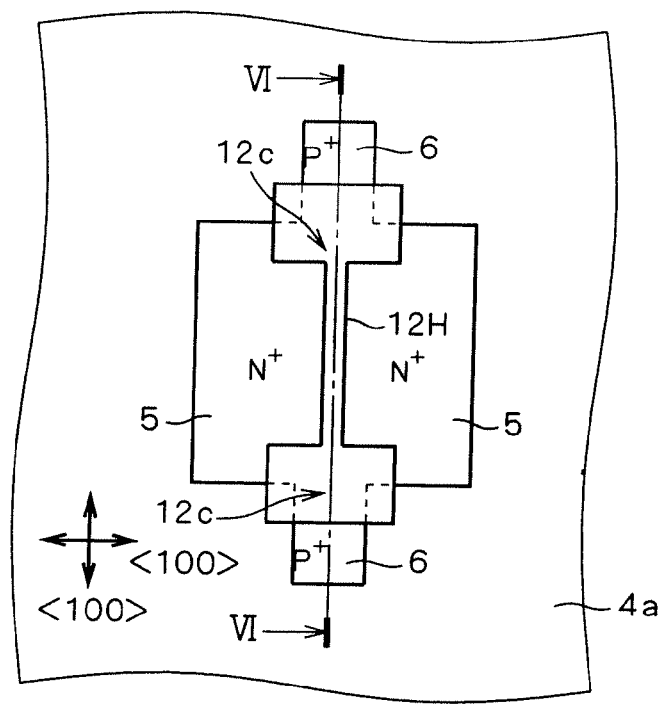
F I G . 6
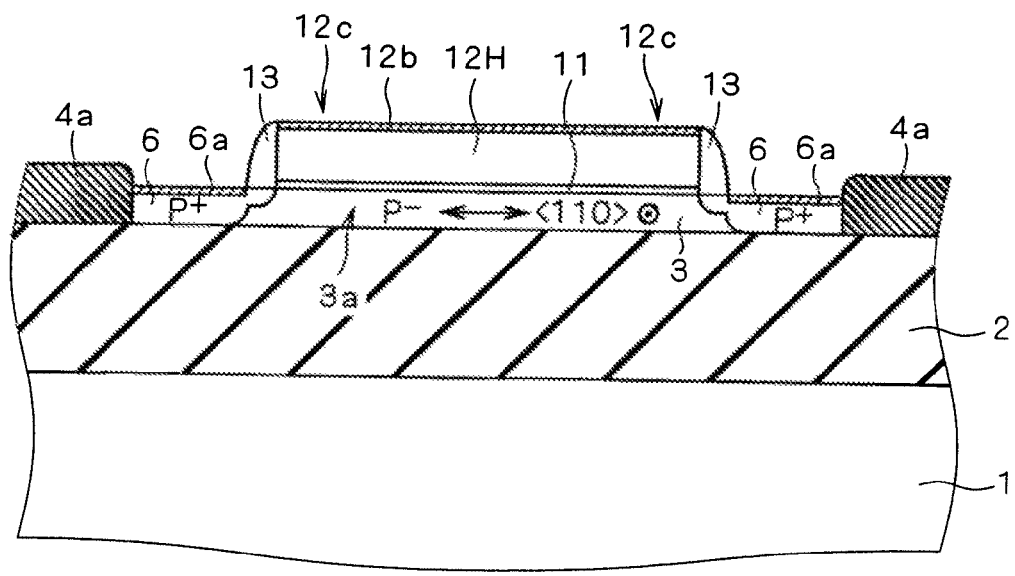

F I G . 1 1
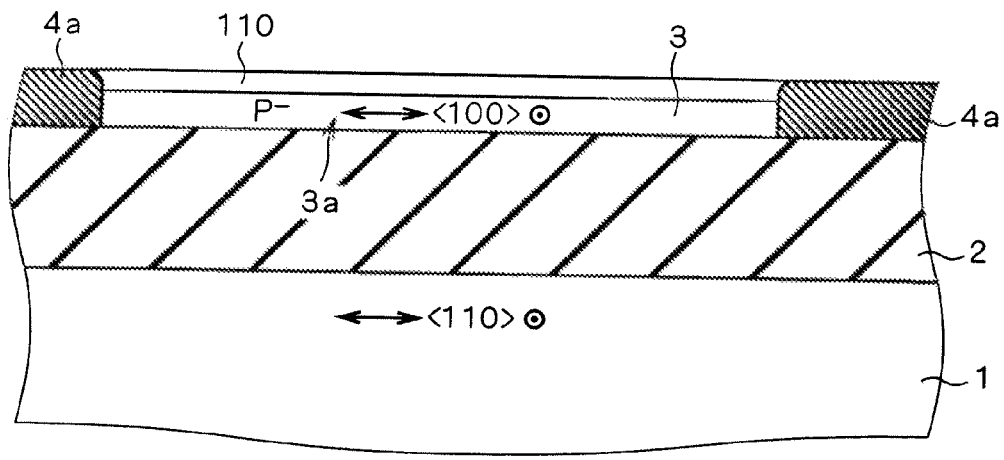
F I G . 1 2
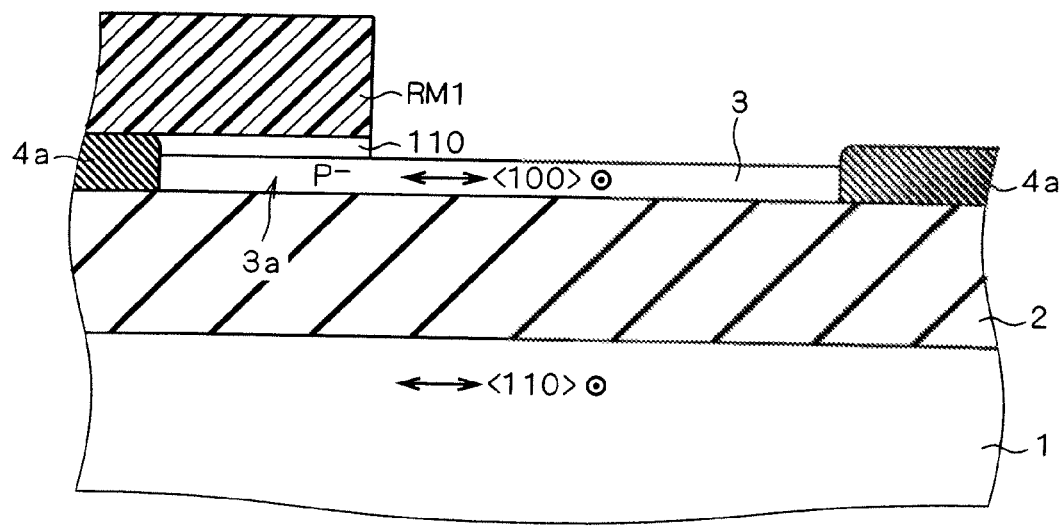

F I G . 2 3
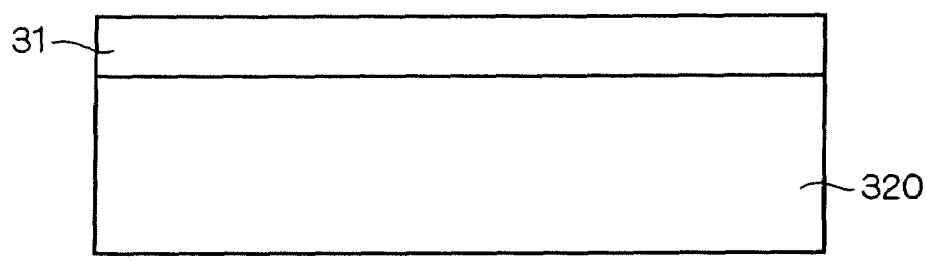
F I G . 2 4
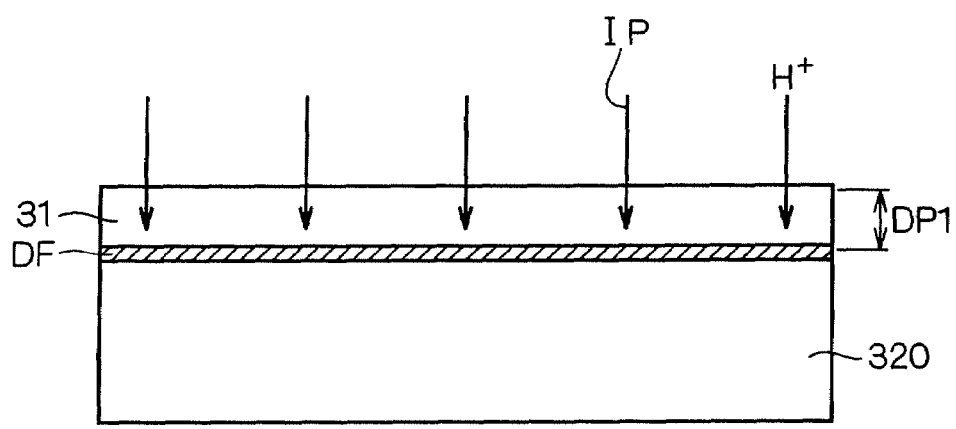

F I G . 2 7
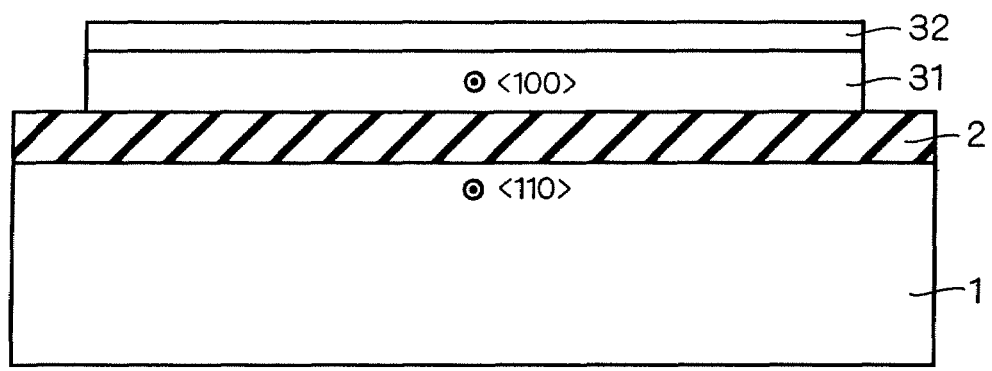

SEMICONDUCTOR MIS TRANSISTOR FORMED ON SOI SEMICONDUCTOR SUBSTRATE

CROSS-REFERENCE TO RELATED APPLICATIONS

This application is a Divisional of and claims the benefit of priority under 35 USC §120 from U.S. Ser. No. 11/061,645, filed Feb. 22, 2005 and claims the benefit of priority under 35 USC §120 from U.S. Ser. No. 10/459,490, filed Jun. 12, 2003 and claims the benefit of priority under 35 U.S.C. §119 from Japanese Patent Application priority document P2002-302833, filed Oct. 17, 2002.

BACKGROUND OF THE INVENTION

1. Field of the Invention

The present invention relates to a semiconductor device formed on a semiconductor substrate, and a method of manufacturing the same.

2. Description of the Background Art

One example of a conventional semiconductor device is a P-channel MOS (Metal Oxide Semiconductor) transistor formed on an SOI (Silicon On Insulator or Semiconductor On Insulator) substrate.

In the SOI substrate, a support substrate such as a silicon substrate, an oxide film layer and an SOI layer are stacked in this order. The P-channel MOS transistor comprises a gate electrode, a gate insulating film and P-type source/drain active layers.

In the formation of the P-channel MOS transistor on the SOI substrate, a multilayer structure of the gate electrode and the gate insulating film is formed on the surface of the SOI layer, and the source/drain active layers are formed in the SOI layer to sandwich the gate electrode.

A conventional semiconductor device has generally been configured such that a direction of a channel between source and drain of a MOS transistor is aligned parallel to a <110> crystal direction (orientation) of a semiconductor wafer.

However, if the channel direction is aligned parallel to a <100> crystal direction instead of being parallel to the <110> crystal direction, transistor characteristics can be varied. More specifically, it has been known that the channel direction aligned parallel to the <100> crystal direction results in an approximately 15-percent improvement in current drive capability of a P-channel MOS transistor and also in a reduced short channel effect (see Japanese patent publication No. 2002-134374).

The reason for improved current drive capability is considered to be higher hole mobility in the <100> crystal direction than in the <110> crystal direction, and the reason for reduced short channel effect is considered to be a smaller diffusion coefficient of boron for the <100> crystal direction than for the <110> crystal direction.

Thus, also for formation of the P-channel MOS transistor on the SOI substrate, the channel direction therein should be aligned parallel to the <100> crystal direction of the SOI layer. For this, for example an SOI substrate should be employed which is formed such that a <100> crystal direction of the SOI layer on the surface side is aligned with a <110> crystal direction of the support substrate, and on the surface of that SOI substrate, a device such as the P-channel MOS transistor should be formed.

In the case of (100) wafers, a {110} crystal plane is a cleavage plane. Thus, if a <100> crystal direction of a wafer for the SOI layer is aligned with a <110> crystal direction of a wafer for the support substrate for bonding, a complete whole wafer can, at the time of cleavage for test and research, be cleaved along the cleavage plane of the wafer for the support substrate which makes up a large portion of the complete wafer thickness. This brings the advantage that a section of the support substrate along the <110> crystal direction and a section of the SOI layer along the <100> crystal direction can be exposed at the same time.

Such a technique of aligning the <100> crystal direction of the SOI layer with the <110> crystal direction of the support substrate has been disclosed in, for example, Japanese patent publications Nos. 2002-134374 and 7-335511.

Other prior art reference information relating to the invention of this application includes the following unpatented references: (1) Y. Hirano, et al., "Bulk-Layout-Compatible 0.18 μm SOI-CMOS Technology Using Body-Fixed Partial Trench Isolation (PTI)," USA, IEEE 1999 SOI conf., p. 131-132; (2) S. Maeda, et al., "Suppression of Delay Time Instability on Frequency Using Field Shield Isolation Technology for Deep Sub-Micron SOI Circuits," USA, IEDM, 1996, p. 129-132; and (3) L.-J. Hung, et al., "Carrier Mobility Enhancement in Strained Si-On-Insulator Fabricated by Wafer Bonding," USA, 2001 Symposium on VLSI Technology, p. 57-58.

SUMMARY OF THE INVENTION

For reasons such as improved current drive capability, a SOI substrate formed to align a <100> crystal direction of an SOI layer with a <110> crystal direction of a support substrate is suitable for formation of a P-channel MOS transistor, but the P-channel MOS transistor is not the only semiconductor device that is capable of making effective use of the features of such an SOI substrate.

An object of the present invention is, therefore, to provide a semiconductor device which is formed on a semiconductor substrate and is capable of making effective use of the features of the semiconductor substrate, and to provide a method of manufacturing the same.

According to a first aspect of the present invention, the semiconductor device includes an SOI (Semiconductor On Insulator) substrate, an N-channel MIS (Metal Insulator Semiconductor) transistor, and a P-type active layer for body voltage application. In the SOI substrate, a support substrate, an oxide film layer and an SOI layer are stacked in this order, and the support substrate and the SOI layer have different crystal orientations with respect to each other. The N-channel MIS transistor includes a gate insulating film formed on the SOI layer, a gate electrode formed on the gate insulating film, an N-type source/drain active layer formed adjacent to the gate electrode in the SOI layer, and a P-type body layer formed at least under the gate electrode in the SOI layer. The P-type active layer for body voltage application is formed in the SOI layer and in contact with the P-type body layer. A path connecting the P-type body layer and the P-type active layer for body voltage application is aligned parallel to a <100> crystal direction of the SOI layer.

Since the support substrate and the SOI layer in the SOI substrate have different crystal orientations with respect to each other, the semiconductor device formed on the SOI substrate can be arranged in alignment with the crystal orientation of the SOI layer which is adjusted for improvement in the characteristics of the semiconductor device and also, a section parallel to that crystal orientation can be readily obtained at the time of cleavage for test and research. Further, the path connecting the P-type body layer and the P-type active layer for body voltage application is aligned parallel to the <100> crystal orientation of the SOI layer. Since the hole mobility is higher in the <100> crystal direction, the application of voltage through the P-type active layer for body voltage application to the P-type body layer can speed up voltage transmission to the P-type body layer and can improve voltage fixing capability in the P-type body layer. The improved voltage fixing capability enhances circuit stability, thereby reducing low frequency noise. This results in improved linear characteristics of the semiconductor device and improved hot carrier resistance. Here, cleavage can readily produce a section along the channel width or length of the N-channel MOS transistor with improved voltage fixing capability.

According to a second aspect of the present invention, the semiconductor device includes an SOI (Semiconductor On Insulator) substrate, an MIS (Metal Insulator Semiconductor) capacitor, and a P-type active layer. In the SOI substrate, a support substrate, an oxide film layer, and an SOI (Semiconductor On insulator) layer are stacked in this order, and the support substrate and the SOI layer have different crystal orientations with respect to each other. The MIS capacitor includes a gate insulating film formed on the SOI layer, a gate electrode formed on the gate insulating film, and a P-type body layer formed at least under the gate electrode in the SOI layer. The P-type active layer is formed in the SOI layer and electrically connected to the P-type body layer. A path connecting the P-type body layer and the P-type active layer is aligned parallel to a <100> crystal direction of the SOI layer.

Since the support substrate and the SOI layer in the SOI substrate have different crystal orientations with respect to each other, the crystal orientation of the SOI layer can be adjusted for improvement in the characteristics of the semiconductor device formed on the SOI substrate and also, the whole SOI substrate can, at the time of cleavage for test and research, be divided along a cleavage plane of the support substrate. Further, the path connecting the P-type body layer and the P-type active layer for body voltage application is aligned parallel to the <100> crystal orientation of the SOI layer. Since the hole mobility is higher in the <100> crystal direction, the application of voltage through the P-type active layer to the P-type body layer can speed up voltage transmission to the P-type body layer and can improve voltage fixing capability in the P-type body layer. Here, cleavage can readily produce a section along a direction of the path connecting the P-type body layer and the P-type active layer of the MIS capacitor with improved voltage fixing capability.

According to a third aspect of the present invention, the semiconductor device includes an SOI (Semiconductor On Insulator) substrate, an MIS (Metal Insulator Semiconductor) transistor, and another device. In the SOI substrate, a support substrate, an oxide film layer and an SOI (Semiconductor On Insulator) layer are stacked in this order, and the support substrate and the SOI layer have different crystal orientations with respect to each other. The MIS transistor includes a gate insulating film formed on the SOI layer, a gate electrode formed on the gate insulating film, and a source/drain active layer formed adjacent to the gate electrode in the SOI layer. The another device is formed on the SOI layer. The source and the gate of the MIS transistor are short-circuited. The drain of the MIS transistor is connected to a signal input or output of the another device. A channel direction in the MIS transistor is aligned parallel to a <100> crystal direction of the MIS transistor.

Since the support substrate and the SOI layer in the SOI substrate have different crystal orientations with respect to each other, the crystal orientation of the SOI layer can be adjusted for improvement in the characteristics of the semiconductor device formed on the SOI substrate and also, the whole SOI substrate can, at the time of cleavage for test and research, be divided along a cleavage plane of the support substrate. Further, since the source and gate of the MIS transistor are short-circuited and the drain is connected to the signal input or output of the another device, the MIS transistor can act as a protection device for preventing the another device from being broken by surge currents. Further, the channel direction in the MIS transistor is aligned parallel to the <100> crystal orientation of the SOI layer. Since the hole mobility is higher in the <100> crystal direction, for an N-channel MIS transistor, even if impact ionization occurs in the P-type body layer of the N-channel MIS transistor and hole-electron pairs are created, causing a current flow, current can spread quickly in the P-type body layer. This achieves a uniform current distribution and reduces a resistance in the P-type body layer without causing localized current flow. Accordingly, when surge currents flow through the N-channel MIS transistor, it is possible to reduce a voltage drop caused by impact ionization currents flowing through a parasitic bipolar transistor formed of the source, drain and body of the N-channel MIS transistor and to enhance ESD (Electro Static Discharge) resistance. For a P-channel MIS transistor, when a surge current flows through the MIS transistor, current can flow over the P-channel with low resistance. Here, cleavage can readily produce sections along the channel widths or lengths of the N-channel MIS transistor with enhanced ESD resistance and the P-channel MIS transistor with low resistance to current flow.

According to a fourth aspect of the present invention, the semiconductor device includes an SOI (Semiconductor On Insulator) substrate and an MIS (Metal Insulator Semiconductor) transistor. In the SOI substrate, a support substrate, an oxide film layer and an SOI layer are stacked in this order, and the support substrate and the SOI layer have different crystal orientations with respect to each other. The MIS transistor includes a gate insulating film formed on the SOI layer, a gate electrode formed on the gate insulating film, and a source/drain active layer formed adjacent to the gate electrode in the SOI layer. By forming a first semiconductor layer in a channel forming region in the SOI layer where a channel is formed and forming a second semiconductor layer in an adjacent region of the channel forming region in the SOI layer, a lattice constant of the first semiconductor layer is made approximately equal to a lattice constant of the second semiconductor layer. A channel direction in the MIS transistor is aligned parallel to a <100> crystal direction of the SOI layer.

Since the lattice constant of the first semiconductor layer is made approximately equal to that of the second semiconductor layer, if the lattice constant of the first semiconductor device is made higher than normal, a tensile stress is applied to the channel forming region from the adjacent region, which improves carrier mobility in the channel. Further, the channel direction in the MIS transistor is aligned parallel to the <100> crystal direction of the SOI layer. Since the hole mobility is higher in the <100> crystal direction, for an N-channel MIS transistor, even if impact ionization occurs in the P-type body layer of the N-channel MIS transistor and hole-electron pairs are created, causing a current flow, current can spread quickly in the P-type body layer. This achieves a uniform current distribution and reduces a resistance in the P-type body layer without causing localized current flow. Accordingly, it is possible to reduce a voltage drop caused by impact ionization current flowing through a parasitic bipolar transistor formed of the source, drain and body of the N-channel MIS transistor and to enhance ESD (Electro Static Discharge) resistance. For a P-channel MIS transistor, current can flow over the P-channel with low resistance. Furthermore, in the SOI substrate, the support substrate and the SOI layer have different crystal orientations with respect to each other. This allows the support substrate and the SOI layer to have different cleavage planes and also allows the SOI substrate to have a reduced tendency to break. This means an increase in the strength of the SOI substrate, improving stress control in the MIS transistor manufacturing process. Here, cleavage can readily produce sections along the channel widths or lengths of the N-channel MIS transistor with enhanced ESD resistance and the P-channel MIS transistor with low resistance to current flow. Also, because of higher hole mobility in the <100> crystal direction and different crystal orientations of the support substrate and the SOI layer, it is possible to make effective use of the feature of the above SOI substrate as having a reduced tendency to break.

According to a fifth aspect of the present invention, the semiconductor device includes an SOI (semiconductor On Insulator) substrate, first and second N-channel MIS (Metal Insulator Semiconductor) transistors, and first and second P-channel MIS transistors. In the SOI substrate, a support substrate, an oxide film layer and an SOI layer are stacked in this order, and the support substrate and the SOI layer have different crystal orientations with respect to each other. The first and second N-channel MIS transistors each include a gate insulating film formed on the SOI layer, a gate electrode formed on the gate insulating film, and an N-type source/drain active layer formed adjacent to the gate electrode in the SOI layer. The first and second P-channel MIS transistors each include a gate insulating film formed on the SOI layer, a gate electrode formed on the gate insulating film, and a P-type source/drain active layer formed adjacent to the gate electrode in the SOI layer. The drain of the first N-channel MIS transistor is connected to the gate of the second N-channel MIS transistor, and the drain of the second N-channel MIS transistor is connected to the gate of the first N-channel MIS transistor. A predetermined potential is applied to the sources of the first and second N-channel MIS transistors. The drain of the first N-channel MIS transistor is also connected to the drain of the first P-channel MIS transistor, and the drain of the second N-channel MIS transistor is also connected to the drain of the second P-channel MIS transistor. Channel directions in both the first and second N-channel MIS transistors are aligned parallel to a <100> crystal direction of the SOI layer, and channel directions in both the first and second P-channel MIS transistors are aligned parallel to a <110> crystal direction of the SOI layer.

The first and second N-channel MIS transistors and the first and second P-channel MIS transistors are connected to form a SRAM. The channel directions in the first and second N-channel MIS transistors which act as driver transistors for storing information in the SRAM are aligned parallel to the <100> crystal direction of the SOI layer. Also, the channel directions in the first and second P-channel MIS transistors which act as access transistors for controlling the exchange of information in the SRAM are aligned parallel to the <110> crystal direction of the SOI layer. Since the hole mobility in the <110> crystal direction is lower than that in the <100> crystal direction, carrier mobility in the first and second P-channel MIS transistors as access transistors can be reduced. This results in an improvement conductance ratio of the driver transistors to the access transistors and in stabilized SRAM operation. Here, cleavage can readily produce sections along the channel widths or lengths of the MIS transistors that allow stabilized SRAM operation.

These and other objects, features, aspects and advantages of the present invention will become more apparent from the following detailed description of the present invention when taken in conjunction with the accompanying drawings.

BRIEF DESCRIPTION OF THE DRAWINGS

FIGS. 5 and 6 are respectively a top plan view and a cross-sectional view showing a modification of the semiconductor device according to the first preferred embodiment;

FIGS. 10 through 14 are cross-sectional views showing a method of manufacturing the modification of the semiconductor device according to the first preferred embodiment;

FIGS. 23 through 27 are cross-sectional views showing a method of manufacturing the semiconductor device according to the sixth preferred embodiment;

DESCRIPTION OF THE PREFERRED EMBODIMENTS

First Preferred Embodiment

This preferred embodiment provides a semiconductor device and a method of manufacturing the same. In the semiconductor device, an N-channel MOS transistor including a P-type body layer, and a P-type active layer for body voltage application which is in contact with the P-type body layer are formed on an SOI substrate which is formed to align a <100> crystal direction of an SOI layer with a <110> crystal direction of a support substrate, and a path connecting the P-type body layer and the P-type active layer for body voltage application is aligned parallel to the <100> crystal direction of the SOI layer.

Figure 1:
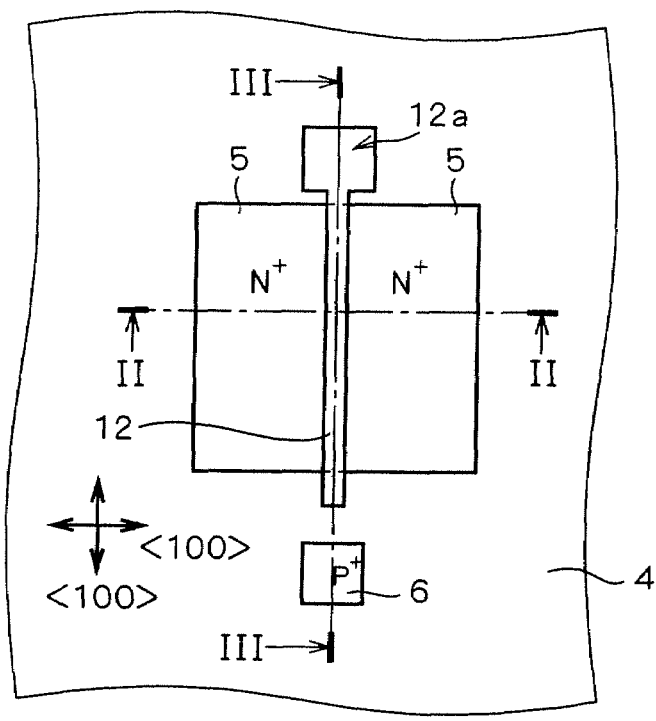
FIG. 1 is a top plan view showing a semiconductor device according to a first preferred embodiment.
Figure 2:
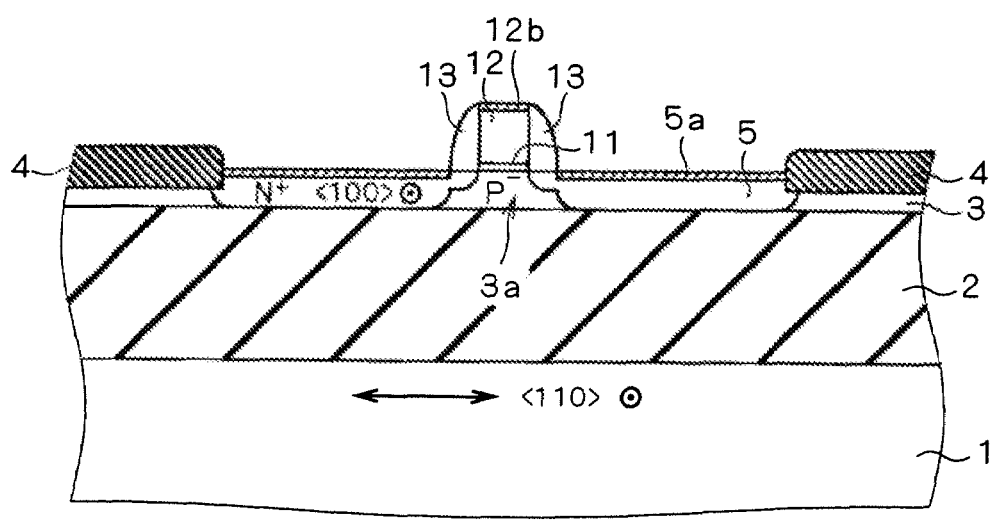
FIGS. 2 and 3 are cross-sectional views showing the semiconductor device according to the first preferred embodiment.
Figure 3:
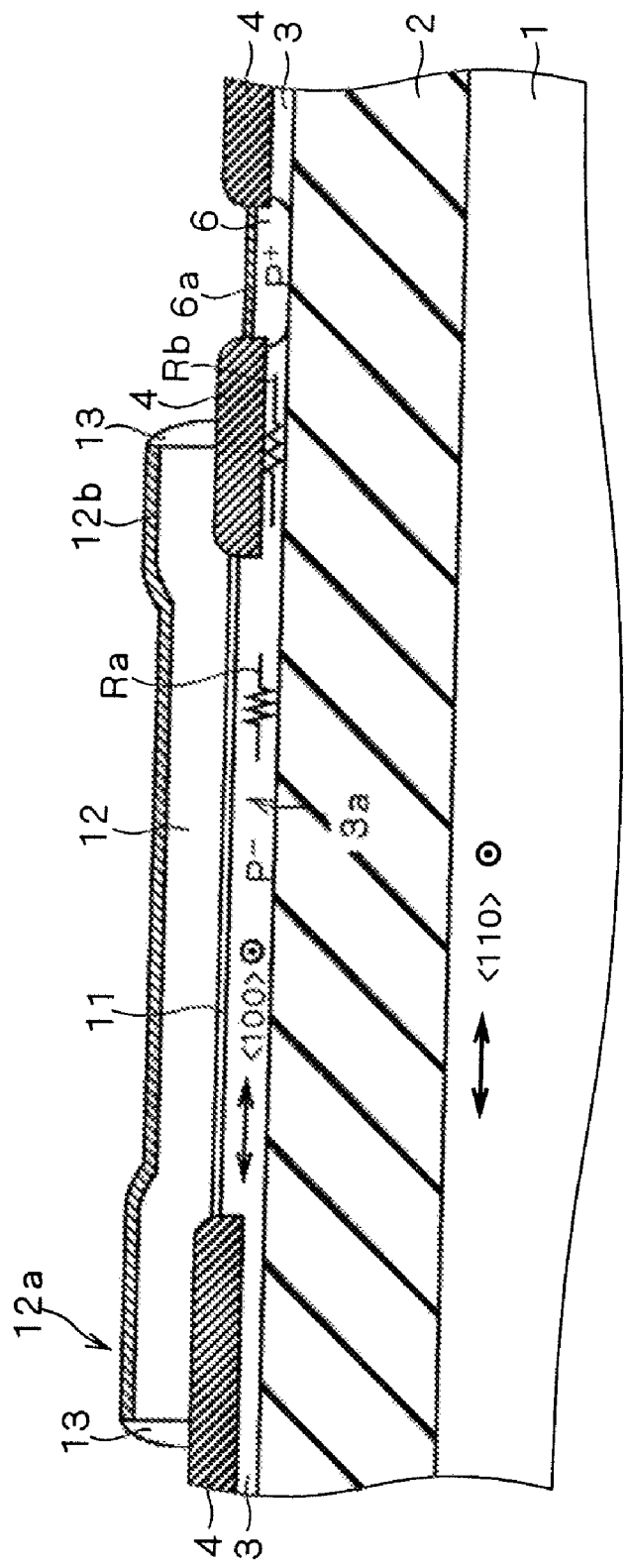

The semiconductor device according to this preferred embodiment is shown in FIGS. 1 through 3. FIG. 2 is a diagram showing a section taken along the section line II-II of FIG. 1, and FIG. 3 is a diagram showing a section taken along the section line III-III of FIG. 1.

This semiconductor device is an N-channel MOS transistor, which is formed on the surface of an SOI substrate where a support substrate 1 such as a silicon substrate, an oxide film layer 2 and an SOI layer 3 such as a silicon layer are stacked in this order, or more specifically, which is formed in the SOI layer 3. The N-channel MOS transistor comprises a gate electrode 12, a gate insulating film 11, and N-type source/drain active layers 5.

A multilayer structure of the gate electrode 12 and the gate insulating film 11 is formed on the surface of the SOI layer 3, and the N-type source/drain active layers 5 are formed adjacent to the gate electrode 12 in the SOI layer 3 in plan view. The outer edges of the source/drain active layers 5 are defined by an element isolation region 4 of a partial isolation type. As employed herein, "partial isolation" refers to an element isolation technique in which the element isolation region 4 does not extend to the oxide film layer 2 in the direction of thickness of the SOI layer 3 and therefore, part of the SOI layer 3 remains to be electrically connected with other regions (for details about "partial isolation", see the unpatented reference (1)).

On the side surfaces of the gate electrode 12 and the gate insulating film 11, a sidewall insulation film 13 is formed, and on the surfaces of the gate electrode 12 and the source/drain active layers 5, silicided regions 12b and 5a are formed, respectively. A portion of the gate electrode 12 which is adjacent to the source/drain active layers 5 is made thin to reduce the gate length, whereas an extension portion 12a thereof is made wide for connection to a contact plug (not shown). A portion of the SOI layer 3 which is located under the gate electrode 12 forms a relatively low concentration (P$^-$) of P-type body layer 3a. A channel is formed in at least a portion of the P-type body layer 3a which is in contact with the gate insulating film 11.

In the SOI layer 3, a relatively high concentration (P$^+$) of P-type active layer 6 for body voltage application is formed which is in contact with the P-type body layer 3a. A path connecting the P-type body layer 3a and the P-type active layer 6 for body voltage application is aligned parallel to a <100> crystal direction of the SOI layer 3. Also, a silicided region 6a is formed on the surface of the P-type active layer 6 for body voltage application. On the silicided region 6a, a contact plug (not shown) is connected, through which a potential of the P-type body layer 3a is fixed. The fixed potential of the P-type body layer 3a can enhance stability in high speed operation and minimize degradation in hot carrier resistance (see the unpatented reference (2)).

Now, the support substrate 1 and the SOI layer 3 in the SOI substrate have different crystal orientations with respect to each other. More specifically, a <100> crystal direction of the SOI layer 3 is aligned with a <110> crystal direction of the support substrate 1 (in FIGS. 2 and 3, circles each including a point indicate a direction perpendicular to the plane of the paper, and the same can be said of the following drawings).

Figure 4:
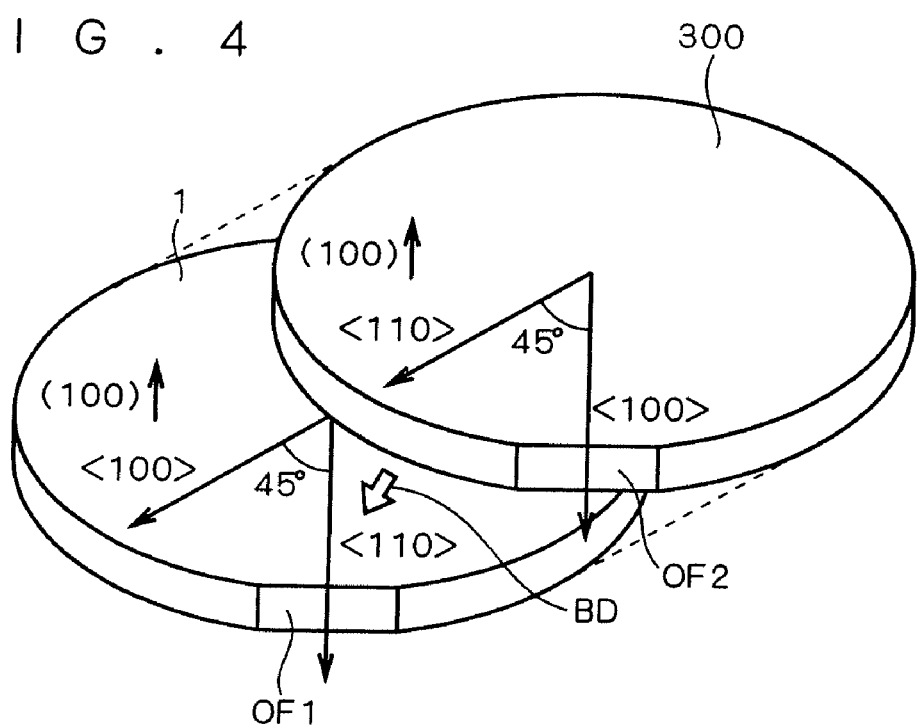
FIG. 4 is a diagram showing a manufacturing process of an SOI substrate in which a support substrate and an SOI layer have different crystal orientations with respect to each other.

FIG. 4 shows a manufacturing process of such an SOI substrate. A wafer for the support substrate 1 has an orientation flat OF1 formed in <110> crystal orientation, and a wafer 300 for the SOI layer which is to be the base of the SOI layer 3 and the oxide film layer 2 has an orientation flat OF2 formed in <100> crystal orientation. Using the orientation flats OF1 and OF2 for alignment, wafer bonding BD is performed. This produces, as shown in FIGS. 2 and 3, the SOI substrate including the support substrate 1, the oxide film layer 2, and the SOI layer 3.

In the semiconductor device according to this preferred embodiment, the support substrate 1 and the SOI layer 3 in the SOI substrate are bonded to have different crystal orientations with respect to each other, so that the <100> crystal direction of the SOI layer 3 is aligned with the <110> crystal direction of the support substrate 1. Thus, the N-channel MOS transistor can be arranged in a crystal orientation adjusted for improvement in characteristics and also, a section parallel to that crystal orientation can be obtained at the time of cleavage for test and research.

Further, in the semiconductor device according to this preferred embodiment, the path connecting the P-type body layer 3a and the P-type active layer 6 for body voltage application is aligned parallel to the <100> crystal direction of the SOI layer 3. Since hole mobility is higher in the <100> crystal direction, it is possible to reduce, in the above path, parasitic resistance Ra on the SOI layer 3 located under the gate insulating film 11 and parasitic resistance Rb on the SOI layer 3 located under the element isolation region 4. Especially the parasitic resistance Rb under the element isolation region 4 of the partial isolation type is a resistance in a narrow and small area; therefore, the effect of reducing the parasitic resistance Rb is great.

Accordingly, the application of voltage through the P-type active layer 6 for body voltage application to the P-type body layer 3a can speed up voltage transmission to the P-type body layer 3a and can improve voltage fixing capability in the P-type body layer 3a. Such an improved voltage fixing capability can also enhance circuit stability, thereby reducing low frequency noise. This results in improved linear characteristics of the semiconductor device and improved hot carrier resistance.

Here, cleavage can readily produce a section along the channel width or length of the N-channel MOS transistor with improved voltage fixing capability.

The N-channel MOS transistor is element-isolated by the element isolation region 4 of the partial isolation type. This reduces the amount of stress applied from the element isolation region 4 to the aforementioned path connecting the P-type body layer 3a and the P-type active layer 6 for body voltage application, as compared with the amount that would be applied if element isolation is accomplished through the use of an element isolation region of a complete isolation type which extends to the oxide film layer 2 in the direction of thickness of the SOI layer 3. Accordingly, the hole mobility in the above path cannot easily be reduced.

The configurations of the gate electrode 12 and the P-type active layer 6 for body voltage application are not limited to those illustrated in FIGS. 1 to 3, but may for example, be as shown in FIGS. 5 and 6. FIG. 6 is a diagram showing a section taken along the section line VI-VI of FIG. 5.

In those configurations, extension portions 12c for connection to contact plugs (not shown) are provided on both ends of a gate electrode 12H in a direction along the gate width. The P-type active layers 6 for body voltage application are projected from the source/drain active layers 5 beyond the extraction portions 12c to positions spaced from the gate electrode 12H.

Thus, instead of the element isolation region 4 of the partial isolation type, an element isolation region 4a of a complete isolation type can be employed.

Figure 7:
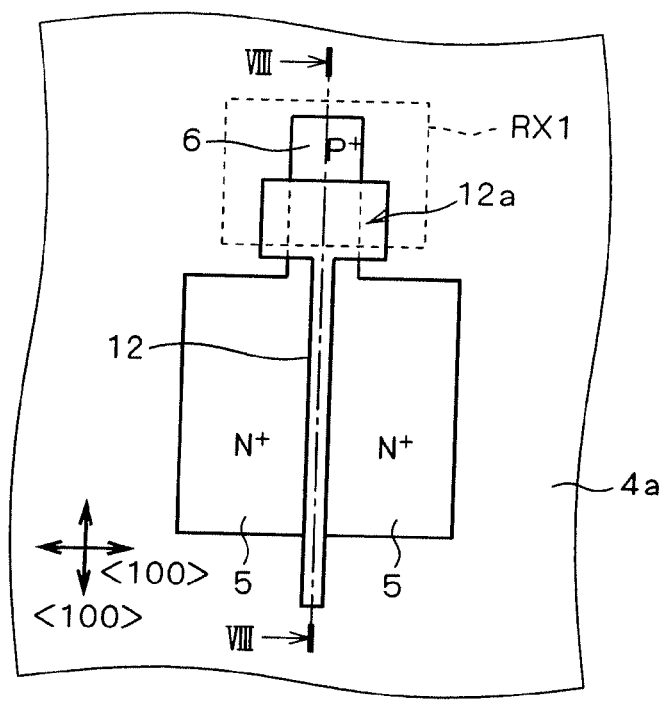
FIGS. 7 and 8 are respectively a top plan view and a cross-sectional view showing another modification of the semiconductor device according to the first preferred embodiment.
Figure 8:
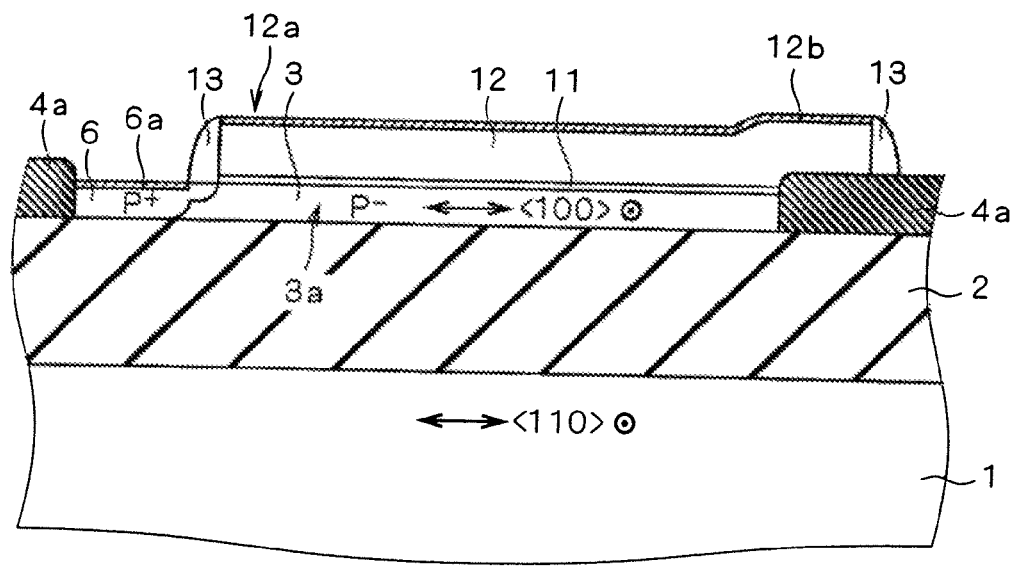

Other than the configurations shown in FIGS. 5 and 6, configurations as shown in FIGS. 7 and 8 may be employed. FIG. 8 is a diagram showing a section taken along the section line VIII-VIII of FIG. 7.

In those configurations, instead of placing, as in the case of FIGS. 1 to 3, the P-type active layer 6 for body voltage application in a position opposite from the extraction portion 12a of the gate electrode 12 as seen from the source/drain active layers 5, the P-type active layer 6 for body voltage application is projected from the source/drain active layers 5 beyond the extraction portion 12a to a position spaced from the gate electrode 12. Thus, also in FIG. 8, instead of the element isolation region 4 of the partial isolation type, the element isolation region 4a of the complete isolation type can be employed.

Figure 9:
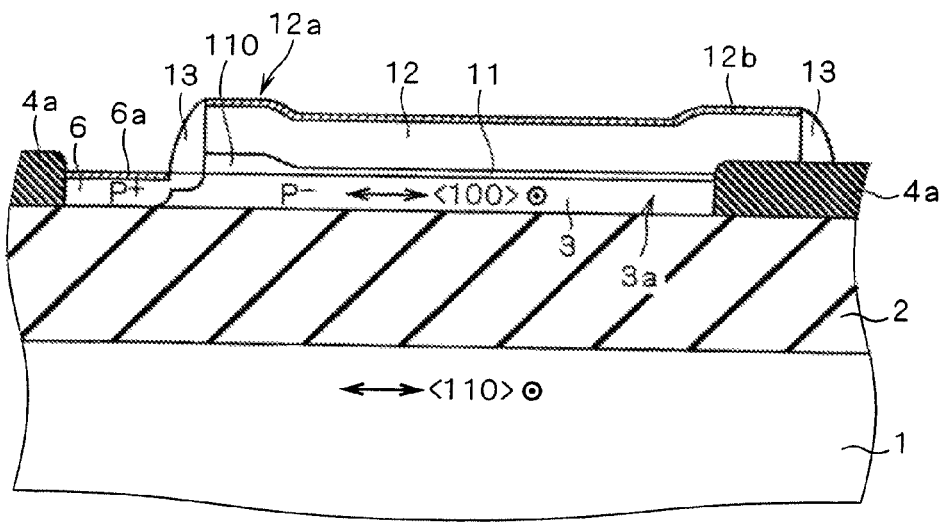
FIG. 9 is a cross-sectional view showing still another modification of the semiconductor device according to the first preferred embodiment.

Also, configurations may be as shown in FIG. 9, instead of those shown in FIG. 8. More specifically, a thick portion 110 of the gate insulating film 11 which is located under a connection with a contact plug may be formed to have a greater film thickness than the other portion. The thickness of the gate insulating film 11 may, for example, be in the range of 1 to 5 nm, and the thickness of the thick portion 110 may, for example, be in the range of 5 to 15 nm. By so doing, the thick portion 110 is located directly under the contact plug (not shown) connected to the gate electrode 12, which can reduce parasitic resistance between the contact plug and the SOI layer 3.

Mask data for use in the formation of the thick portion 110 is indicated as RX1 in FIG. 7. According to the mask data RX1, the range of the thick portion 110 is extended not only under the extraction portion 12a of the gate electrode 12 but also over the P-type active layer 6 for body voltage application and the periphery thereof. In the present example, the mask data RX1 is of a rectangular shape in plane view, having one side which is not in perfect alignment with one side of the extraction portion 12a of the gate electrode 12 on the source/drain region side but which is slightly shifted toward the P-type active layer 6 for body voltage application. This is for consideration of misalignment of an actual mask.

Now, a method of manufacturing a semiconductor device having the configuration shown in FIG. 9 will be described with reference to FIGS. 10 through 14.

Figure 10:
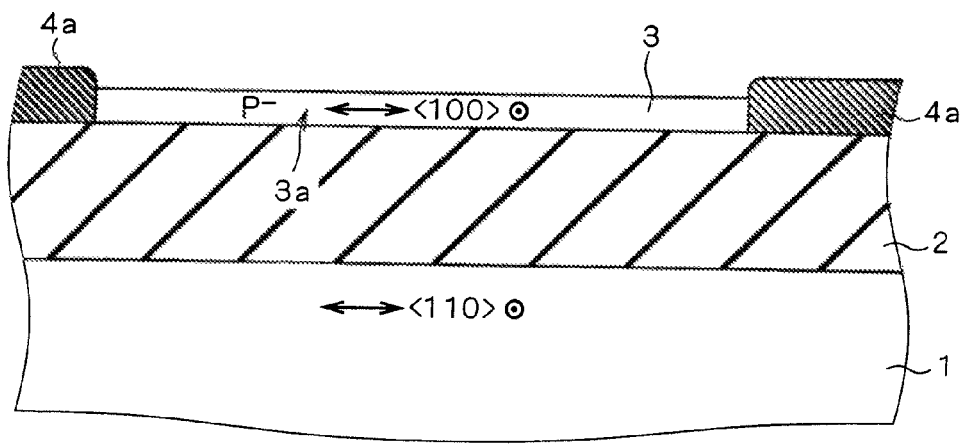

First, as shown in FIG. 10, the SOI substrate is prepared which comprises the support substrate 1, the oxide film layer 2 and the SOI layer 3 and in which the support substrate 1 and the SOI layer 3 have different crystal orientations with respect to each other. Then, the element isolation region 4a of the complete isolation type is formed through the SOI layer 3 to extend to the oxide film layer 2 and to section the SOI layer 3. Then, an impurity is implanted into the SOI layer 3 to form the relatively low concentration (P⁻) of P-type body layer 3a.

In the step of FIG. 11, the thick portion 110 of the gate insulating film 11 with a thickness of 5 to 15 nm is formed over the entire surface of the SOI layer 3.

In the step of FIG. 12, a resist mask RM1 is patterned according to the mask data RX1 to define where the thick portion 110 of the gate insulating film 11 should be left. Thereafter, a portion of the gate insulating film which is not covered with the resist mask RM1 is removed by, for example, wet etching.

Figure 13:
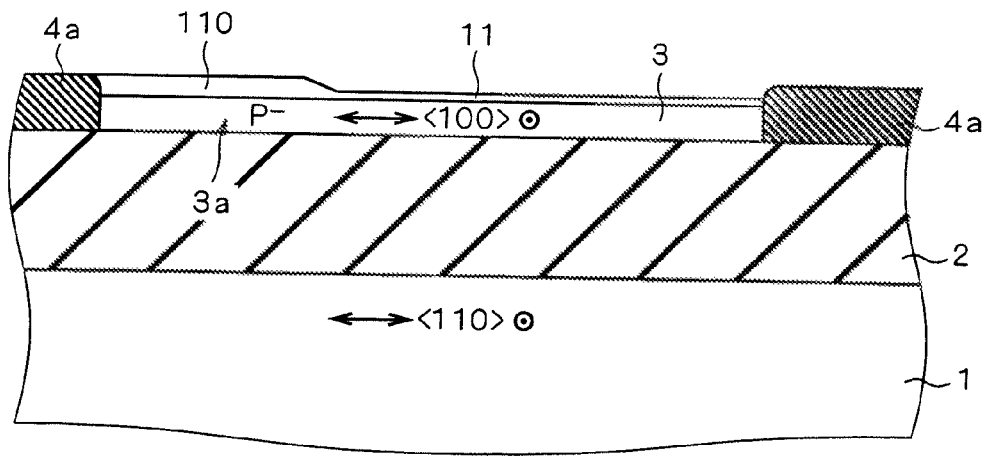

After removal of the resist mask RM1, in the step of FIG. 13, the gate insulating film with a thickness of 1 to 5 nm is formed continuous to the thick portion 110 on the exposed SOI layer 3 by, for example, thermal oxidation, thereby completing the formation of the gate insulating film 11. The gate insulating film 11 may be formed by, for example, CVD (Chemical Vapor Deposition).

Figure 14:
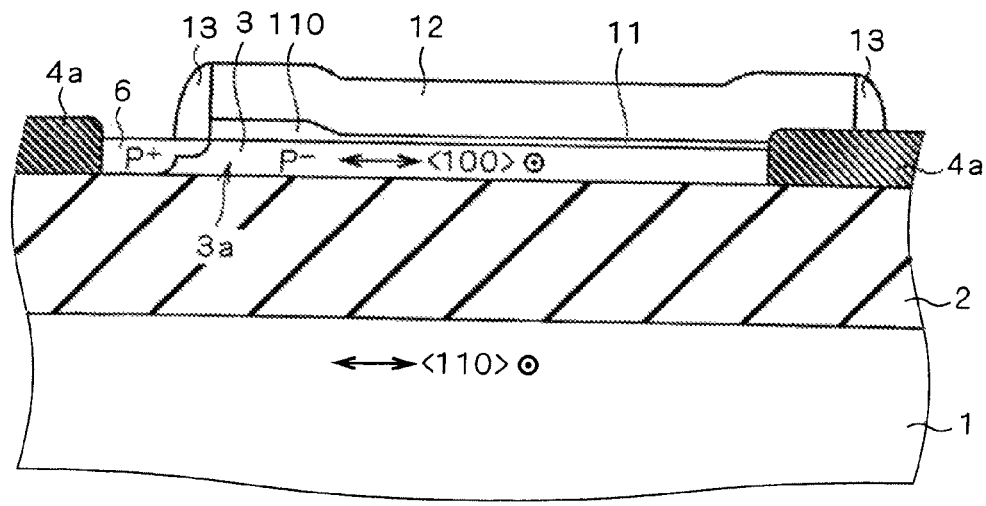

In the step of FIG. 14, a polysilicon film or the like is formed on the gate insulating film 11 including the thick portion 110 and patterned by photolithographic or etching techniques to form the gate electrode 12. The gate electrode 12 may have the sidewall insulation film 13 formed on its side surface.

Then, impurity implantation is performed for formation of the source/drain active layers 5 (see FIG. 7) and for formation of the P-type active layer 6 for body voltage application. At this time, the element isolation region 4a and the gate electrode 12 are used as masks for implantation; therefore, by forming the element isolation region 4a and the gate electrode 12 in proper position, the P-type active layer 6 for body voltage application can be brought into contact with the P-type body layer 3a, and the path connecting the P-type body layer 3a and the P-type active layer 6 for body voltage application can be aligned parallel to the <100> crystal direction of the SOI layer 3.

This completes the N-channel MOS transistor having the configuration shown in FIG. 7 or 9.

In this manufacturing method, the formation of the gate insulating film 11 including the thick portion 110 on the SOI layer 3 allows the formation of the N-channel MOS transistor having the configuration shown in FIG. 9. Further, if the gate insulating film 11 including the thick portion 110 is formed as an oxide film by, for example, thermal oxidation or CVD, high-precision thickness control can be achieved. Accordingly, even if the SOI layer 3 is made extremely thin, the gate insulating film 11 can be formed to a desired thickness.

Second Preferred Embodiment

Figure 15:
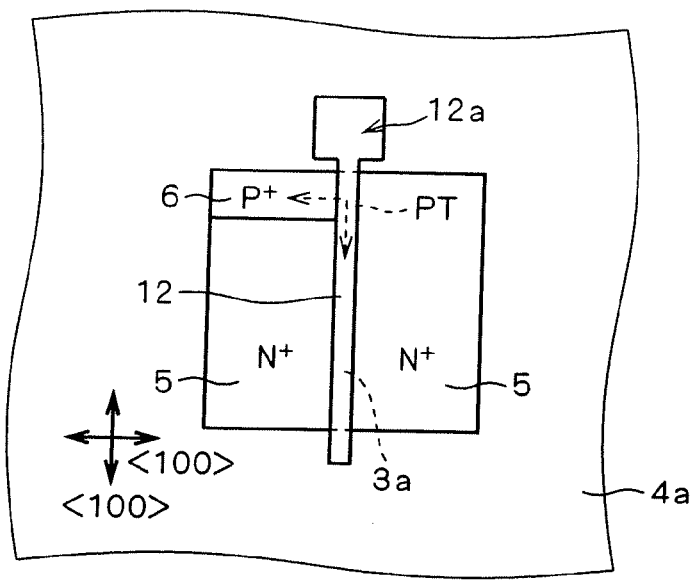
FIG. 15 is a top plan view showing a semiconductor device according to a second preferred embodiment.

A semiconductor device according to this preferred embodiment is shown in FIG. 15. This preferred embodiment provides a modification of the semiconductor device according to the first preferred embodiment, wherein the P-type active layer 6 for body voltage application is located in part of the N-type source/drain active layers 5 in plan view.

The P-type active layer 6 for body voltage application and the P-type body layer 3a are electrically connected to each other by a path PT which is the SOI layer located under the gate electrode 12 (see FIG. 2). Although the path PT is bent halfway, either portion of the path PT before and after the bent portion is aligned parallel to the <100> crystal direction of the SOI layer 3. The other parts of the configuration are identical to those in the semiconductor device shown in FIGS. 1 through 3 and thus not described herein.

In the semiconductor device according to this preferred embodiment, the P-type active layer 6 for body voltage application is located in part of the N-type source/drain active layers 5. This results in space savings as compared to the P-type active layer 6 for body voltage application which is located outside the N-channel MOS transistor as shown in FIGS. 1 to 3.

Further, since the P-type active layer 6 for body voltage application is, in plan view, located adjacent to the gate electrode 12, the path PT connecting the P-type body layer 3a and the P-type active layer 6 for body voltage application can be shortened, which speeds up voltage transmission to the P-type body layer 3a and improves body-voltage fixing capability. Here, in the N-channel MOS transistor with improved voltage fixing capability, a cleavage can readily produce a section along a direction of the path connecting the P-type body layer 3a and the P-type active layer 6 for body voltage application.

Third Preferred Embodiment

This preferred embodiment provides another modification of the semiconductor device according to the first preferred embodiment, wherein the P-type active layer 6 for body voltage application and the gate electrode 12 are short-circuited.

Figure 16:
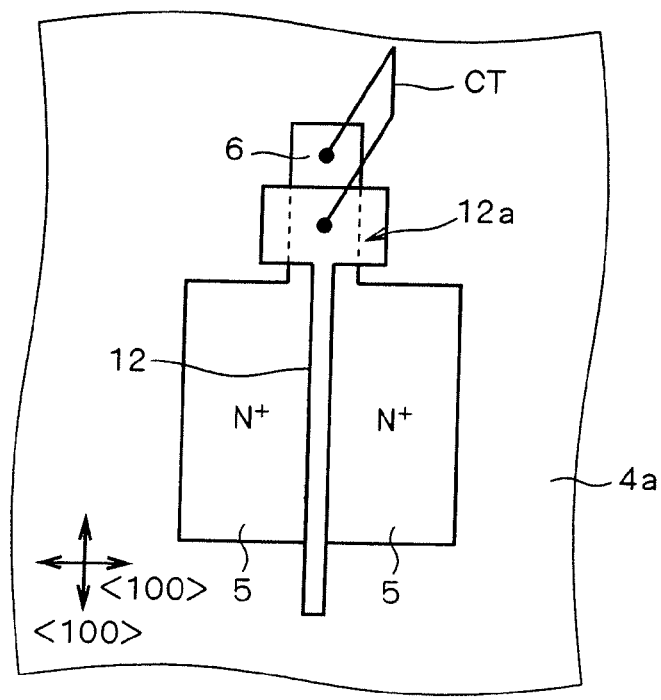
FIG. 16 is a top plan view showing a semiconductor device according to a third preferred embodiment.

The semiconductor device according to this preferred embodiment is shown in FIG. 16. In this semiconductor device, the extraction portion 12a of the gate electrode 12 and the P-type active layer 6 for body voltage application are short-circuited by a contact plug CT. The other parts of the configuration are identical to those in the semiconductor device shown in FIGS. 7 to 9 and thus not described herein.

More specifically, this N-channel MOS transistor is a dynamic threshold MOS transistor. The dynamic threshold MOS transistor varies its threshold voltage by transmitting a voltage applied to the gate electrode, also to the body layer.

The semiconductor device according to the third preferred embodiment can speed up voltage transmission to the P-type body layer 3a and therefore can more quickly vary the threshold voltage. Here, in the N-channel MOS transistor with improved voltage fixing capability, cleavage can readily produce a section along a direction of the path connecting the P-type body layer 3a and the P-type active layer 6 for body voltage application.

Also, the N-type source/drain active layers 5 and the P-type body layer 3a form a parasitic bipolar transistor (the N-type source/drain active layers 5 correspond to the emitter and collector and the P-type body layer 3a corresponds to the base). Since, in general, there is a tradeoff relationship between the value of base resistance and the injection efficiency of emitter, the base resistance value will be increased if the injection efficiency of emitter is reduced. In this preferred embodiment, however, higher hole mobility leads to a reduction in the resistance value (i.e., the base resistance value) in the P-type body layer 3a.

Accordingly, both the injection efficiency of emitter and the base resistance value can be reduced. This improves a current amplification factor $h_{FE}$ of the parasitic bipolar transistor and thereby improve the performance of the dynamic threshold MOS transistor.

Fourth Preferred Embodiment

This preferred embodiment provides a semiconductor device, in which a MOS capacitor including a P-type body layer and a P-type active layer is formed on an SOI substrate which is formed to align a <100> crystal direction of an SOI layer with a <110> crystal direction of a support substrate, and a path connecting the P-type body layer and the P-type active layer is aligned parallel to the <100> crystal direction of the SOI layer.

Figure 17:
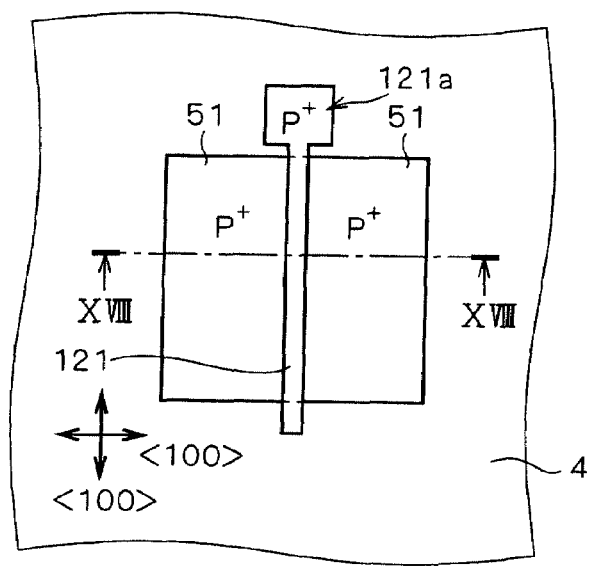
FIG. 17 is a top plan view showing a semiconductor device according to a fourth preferred embodiment.
Figure 18:
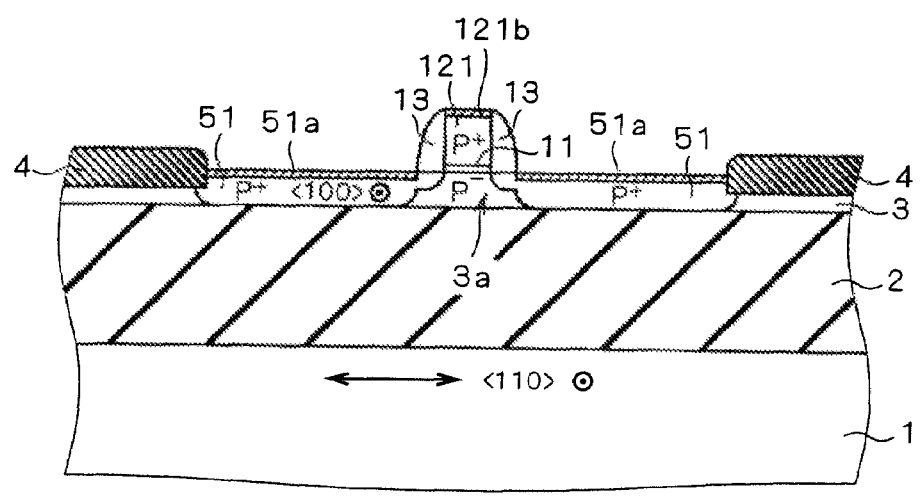
FIG. 18 is a cross-sectional view showing the semiconductor device according to the fourth preferred embodiment.

The semiconductor device according to this preferred embodiment is shown in FIGS. 17 and 18. FIG. 18 is a diagram showing a section taken along the section line XVIII-XVIII of FIG. 17.

This semiconductor device is a MOS capacitor, which is formed on the surface of the SOI substrate where the support substrate 1 such as a silicon substrate, the oxide film layer 2 and the SOI layer 3 are stacked in this order. This MOS capacitor comprises a gate electrode 121 doped with P-type impurities, the gate insulating film 11 and P-type source/drain active layers 51.

A multilayer structure of the gate electrode 121 and the gate insulating film 11 is formed on the surface of the SOI layer 3, and the P-type source/drain active layers 51 are, in plan view, formed adjacent to the gate electrode 121 in the SOI layer 3. The outer edges of the source/drain active layers 51 are defined by the element isolation region 4 of the partial isolation type.

On the side surfaces of the gate electrode 121 and the gate insulating film 11, the sidewall insulation film 13 is formed, and on the surfaces of the gate electrode 121 and the source/drain active layers 51, silicided regions 121b and 51a are formed, respectively. A portion of the gate electrode 121 which is adjacent to the source/drain active layers 51 is made thin to reduce the gate length, whereas an extension portion 121a thereof is made wide for connection to a contact plug (not shown). A portion of the SOI layer 3 which is located under the gate electrode 121 forms the relatively low concentration (P⁻) of P-type body layer 3a. The P-type source/drain active layers 51 are electrically connected to the P-type body layer 3a. A path connecting the P-type body layer 3a and the P-type source/drain active layers 51 is aligned parallel to the <100> crystal direction of the SOI layer 3.

Also in this SOI substrate, the support substrate 1 and the SOI layer 3 have different crystal orientations with respect to each other. More specifically, the <100> crystal direction of the SOI layer 3 is aligned with the <110> crystal direction of the support substrate 1.

In the semiconductor device according to this preferred embodiment, the path connecting the P-type body layer 3a and the P-type source/drain active layers 51 is aligned parallel to the <100> crystal direction of the SOI layer 3. Since hole mobility is higher in the <100> crystal direction, the application of voltage through the P-type source/drain active layers 51 to the P-type body layer 3a can speed up voltage transmission to the P-type body layer 3a with low resistance. This improves the efficiency of variable capacitance (Q value) when this MOS capacitor is used as variable capacitor. This is because the efficiency of variable capacitance (Q value) is inversely proportional to the resistance value in the P-type body layer 3a. Accordingly, the application of this MOS capacitor to an oscillator can reduce the amount of jitter to be caused.

Further, in the semiconductor device according to this preferred embodiment, the support substrate 1 and the SOI layer 3 in the SOI substrate are bonded to have different crystal orientations with respect to each other, so that the <100> crystal direction of the SOI layer 3 is aligned with the <110> crystal direction of the support substrate 1. Thus, the MOS capacitor can be arranged in a crystal orientation adjusted for improvement in characteristics and also, a section parallel to that crystal orientation can be obtained at the time of cleavage for test and research.

Here, cleavage can readily produce a section along the direction of the path connecting the P-type body layer 3a and the P-type source/drain active layers 51 in the MOS capacitor with improved voltage fixing capacity.

Fifth Preferred Embodiment

This preferred embodiment provides a semiconductor device which corresponds to a P-channel and an N-channel MOS transistors formed on the SOI substrate as shown in FIGS. 1 to 3 where the support substrate 1 and the SOI layer 3 have different crystal orientations with respect to each other, and which acts as a protective device against surge currents.

Figure 19:
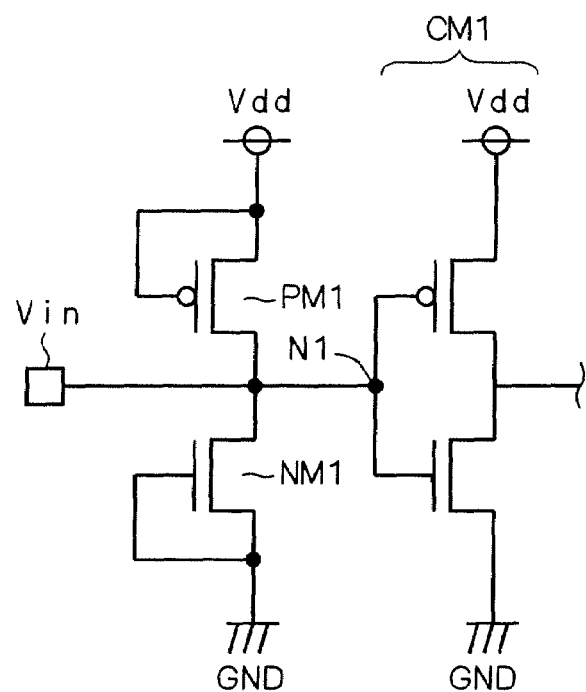
FIGS. 19 and 20 are circuit diagrams showing a semiconductor device according to a fifth preferred embodiment.
Figure 20:
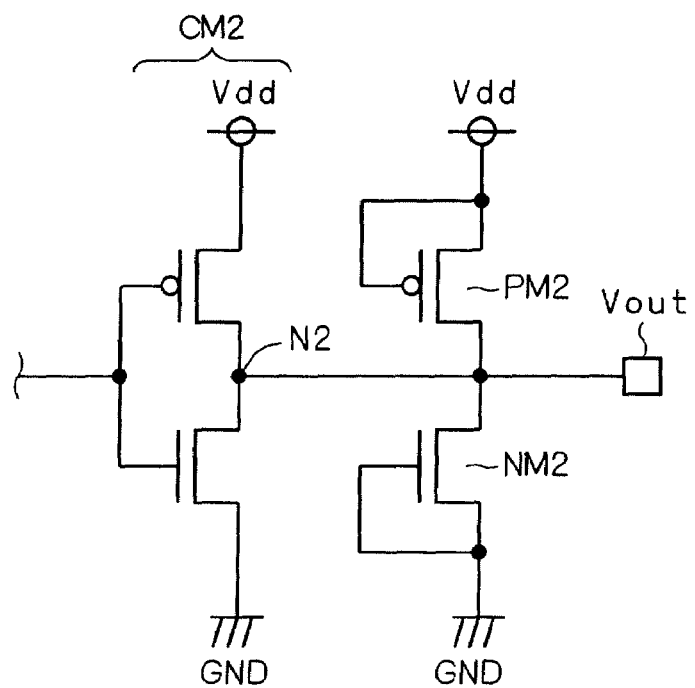

FIG. 19 is a circuit diagram showing that the semiconductor device according to this preferred embodiment is employed as an input protective device in a CMOS transistor CM1, and FIG. 20 is a circuit diagram showing that the semiconductor device according to this preferred embodiment is employed as an output protective device in a CMOS transistor CM2.

In FIG. 19, a P-channel MOS transistor PM1 has its source and gate short-circuited and its drain connected to a voltage signal input end $V_{in}$ and a signal input N1 of the CMOS transistor CM1. A source potential $V_{dd}$ is applied in common to the source and gate of the P-channel MOS transistor PM1.

An N-channel MOS transistor NM1 has its source and gate short-circuited and its drain connected to the voltage signal input end $V_{in}$ and the signal input N1 of the CMOS transistor CM1. A ground potential GND is applied in common to the source and gate of the N-channel MOS transistor NM1.

Like the N-channel MOS transistor shown in FIGS. 1 to 3, the P-channel MOS transistor PM1 and the N-channel MOS transistor NM1 are both formed on the surface of an SOI substrate in which a support substrate such as a silicon substrate, an oxide film layer and an SOI layer such as a silicon layer are stacked in this order. Like the N-channel MOS transistor shown in FIGS. 1 to 3, the transistors PM1 and NM1 each comprise a gate electrode, a gate insulating film and source/drain active layers. Of course, the source/drain active layers in the N-channel MOS transistor NM1 are N-type source/drain active layers doped with N-type impurities, and the source/drain active layers in the P-channel MOS transistor PM1 are P-type source/drain active layers doped with P-type impurities.

In the SOI substrate, a <100> crystal direction of the SOI layer is aligned with a <110> crystal direction of the support substrate. In both the P-channel MOS transistor PM1 and the N-channel MOS transistor NM1, a multilayer structure of the gate electrode and the gate insulating film is formed on the surface of the SOI layer, and the source/drain active layers are formed adjacent to the gate electrode in the SOI layer. Both the P-channel MOS transistor PM1 and the N-channel MOS transistor NM1 are configured such that the channel direction therein is aligned parallel to the <100> crystal direction of the SOI layer.

While the P-type active layer 6 for body voltage application is shown in the N-channel MOS transistor of the first preferred embodiment in FIGS. 1 to 3, the formation of such an active layer for body voltage application is optional for the P-channel MOS transistor PM1 and the N-channel MOS transistor NM1 according to this preferred embodiment.

In FIG. 20, a P-channel MOS transistor PM2 has its source and gate short-circuited and its drain connected to a voltage signal output end $V_{out}$ and a signal output N2 of the CMOS transistor CM2. The source potential $V_{dd}$ is applied in common to the source and gate of the P-channel MOS transistor PM2. An N-channel MOS transistor NM2 has its source and gate short-circuited and its drain connected to the voltage signal output end $V_{out}$ and the signal output N2 of the CMOS transistor CM2. The ground potential GND is applied in common to the source and gate of the N-channel MOS transistor NM2.

Like the P-channel MOS transistor PM1 and the N-channel MOS transistor NM1, the P-channel MOS transistor PM2 and the N-channel MOS transistor NM2 are also formed on the surface of the SOI substrate. Also in this case, both the transistors PM2 and NM2 are configured such that the channel direction therein is aligned parallel to the <100> crystal direction of the SOI layer.

The P-channel MOS transistors PM1, PM2 and the N-channel MOS transistors NM1, NM2 are all protective devices against surge currents. That is, these transistors are in the off state during normal operation and they transition to the on state when a surge current is applied to their drains. This prevents a flow of surge currents to other devices such as the CMOS transistors CM1 and CM2 which are connected to the drains of the MOS transistors as protective devices.

Figure 21:
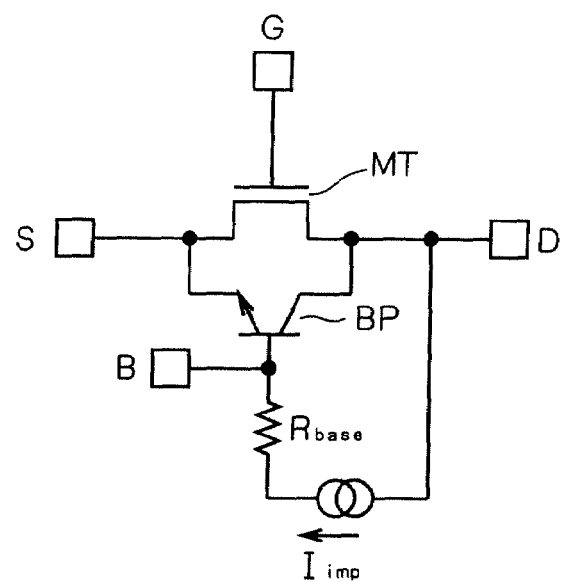
FIG. 21 is a diagram showing a parasitic bipolar transistor in a MOS transistor.

FIG. 21 is a schematic diagram showing a parasitic bipolar transistor BP in a MOS transistor MT. In the parasitic bipolar transistor BP, source S, drain D and body B of the MOS transistor MT correspond respectively to emitter, collector and base.

Upon application of a surge current to the drain, an impact ionization current limp flows from the drain toward the body. At this time, a voltage drop is produced across a base resistance $R_{base}$ (i.e., resistance in the body layer).

Now, according to this preferred embodiment, the P-channel MOS transistors PM1, PM2 and the N-channel MOS transistors NM1, NM2 are all configured so that the channel direction therein is aligned parallel to the <100> crystal direction of the SOI layer.

A <100> crystal direction has higher hole mobility. Thus, for an N-channel MOS transistor, even if impact ionization occurs in a P-type body layer within the N-channel MOS transistor and hole-electron pairs are created, causing a current flow, current can spread quickly in the P-type body layer. This achieves a uniform current distribution and reduces a resistance in the P-type body layer without causing localized current flow. This means a reduction in the base resistance $R_{base}$ in FIG. 21.

Accordingly, when surge currents flow through the N-channel MOS transistors NM1 and NM2, it is possible to reduce a voltage drop caused by impact ionization current flowing through the parasitic bipolar transistors consisting of the sources, drains and bodies of the transistors and to enhance ESD (Electro Static Discharge) resistance.

For a P-channel MOS transistor, when a surge current flows through the MOS transistor, the current can flow over the P-channel with low resistance.

Here, cleavage can readily produce sections along the channel widths or lengths of the N-channel MOS transistors with enhanced ESD resistance and the P-channel MOS transistors with low resistance to current flow.

Sixth Preferred Embodiment

This preferred embodiment provides a semiconductor device in which a MOS transistor having a so-called strained channel structure is formed on an SOI substrate which is formed to align a <100> crystal direction of the SOI layer with a <110> crystal direction of a support substrate.

In the SOI layer, a first semiconductor layer is formed in a channel forming region where a channel is to be formed and a second semiconductor layer is formed in an adjacent region of the channel forming region, whereby the MOS transistor has a configuration in which a lattice constant of the first semiconductor layer is made approximately equal to that of the second semiconductor layer. More specifically, the MOS transistor has a configuration in which a surface side portion (channel forming region) of the SOI layer is a strained silicon channel layer which has a higher lattice constant than normal silicon, and the remaining portion (an adjacent region of the channel forming region) of the SOI layer is a silicon germanium layer which has a higher lattice constant than silicon (see the unpatented reference (3)).

The lattice constant of the surface-side silicon layer which has been epitaxially grown in the adjacent region having a higher lattice constant than silicon is made approximately equal to the lattice constant of the adjacent region by the influence of a lattice arrangement in the adjacent region, and therefore it is higher than the lattice constant of normal silicon. The surface-side silicon layer is thus being under tensile stress. This results in an increase in carrier mobility in the channel, achieving a MOS transistor with improved characteristics. This transistor is the so-called strained channel structure MOS transistor.

In this preferred embodiment, the strained channel structure MOS transistor is formed on the SOI substrate where the support substrate and the SOI layer have different crystal orientations with respect to each other, so that the channel direction therein is aligned parallel to a <100> crystal direction of the SOI layer. Here, the <100> crystal direction of the SOI layer is aligned with a <110> crystal direction of the support substrate.

Figure 22:
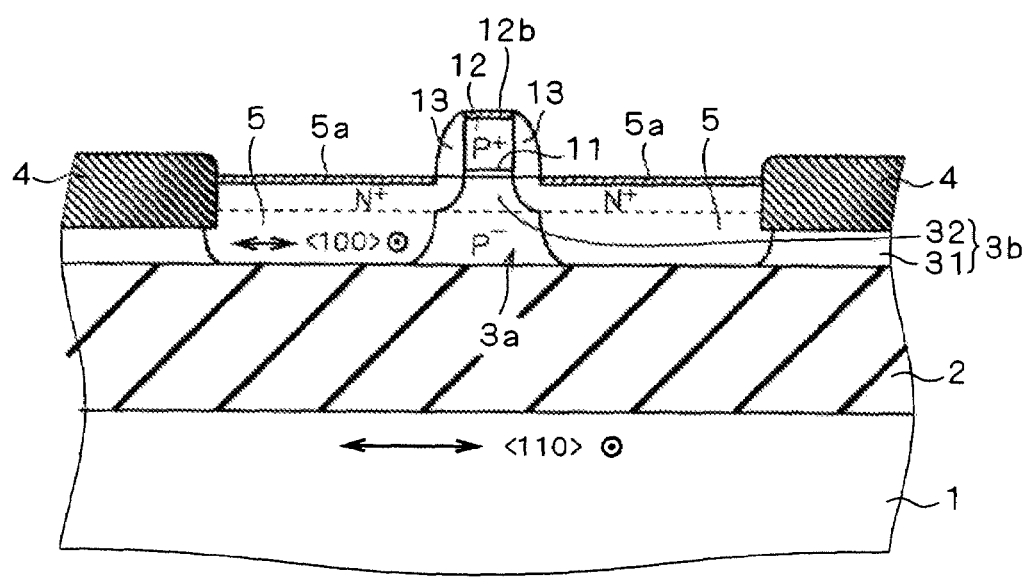
FIG. 22 is a cross-sectional view showing a semiconductor device according to a sixth preferred embodiment.

The semiconductor device according to this preferred embodiment is shown in FIG. 22. This semiconductor device is an N-channel MOS transistor, which is formed on the surface of an SOI substrate where the support substrate 1 such as a silicon substrate, the oxide film layer 2 and an SOI layer 3b are stacked in this order. This N-channel MOS transistor comprises the gate electrode 12, the gate insulating film 11 and the N-type source/drain active layers 5. The SOI layer 3b has a multilayer structure consisting of a strained silicon channel layer 32 and a silicon germanium layer 31. The channel direction in the N-channel MOS transistor is aligned parallel to a <100> crystal direction of the SOI layer 3b.

The multilayer structure of the gate electrode 12 and the gate insulating film 11 is formed on the surface of the SOI layer 3b, and the N-type source/drain active layers 5 are formed adjacent to the gate electrode 12 in the SOI layer 3b in plan view. The outer edges of the source/drain active layers 5 are defined by the element isolation region 4 of the partial isolation type.

On the side surfaces of the gate electrode 12 and the gate insulating film 11, the sidewall insulation film 13 is formed, and on the surfaces of the gate electrode 12 and the source/drain active layer 5, silicided regions 12b and 5a are formed, respectively. A portion of the SOI layer 3b which is located under the gate electrode 12 (a region where the channel of the MOS transistor is to be formed) is the relatively low concentration (P−) of P-type body layer 3a.

In the semiconductor device according to this preferred embodiment, the SOI layer 3b has a multilayer structure consisting of the strained silicon channel layer 32 and the silicon germanium layer 31. Thus, a tensile stress is applied from the silicon germanium layer 31 which is the adjacent region to the strained silicon channel layer 32 as the channel forming region, which improves carrier mobility in the channel.

The channel direction in the MOS transistor is aligned parallel to the <100> crystal direction of the SOI layer 3b. Since hole mobility is higher in the <100> crystal direction, for an N-channel MOS transistor, as described in the fifth preferred embodiment, even if impact ionization occurs in the P-type body layer 3a within the N-channel MOS transistor and hole-electron pairs are created, causing a current flow, current can spread quickly in the P-type body layer 3a. This achieves a uniform current distribution and reduces a resistance in the P-type body layer 3a without causing localized current flow.

Accordingly, it is possible to reduce a voltage drop caused by impact ionization current flowing through a parasitic bipolar transistor formed of the source, drain and body of the N-channel MOS transistor and to enhance ESD resistance.

For a P-channel MOS transistor, current can flow over the P-channel with low resistance.

In the SOI substrate, the support substrate 1 and the SOI layer 3b have different crystal orientations with respect to each other. This allows the support substrate 1 and the SOI layer 3b to have different cleavage planes and also the SOI substrate to have a reduced tendency to break. This means an increase in the strength of the SOI substrate. Increased strength of the SOI substrate can reduce stress which would occur during each manufacturing process. Such stress control is important since transistor characteristics vary with stress. Especially in this preferred embodiment, high-precision stress control is necessary since the strained silicon channel layer 32 is formed by application of tensile stress from the silicon germanium layer 31. The use of this SOI substrate can not only enhance ESD resistance and current drive capability of the P-channel MOS transistor but also improve stress control while reducing uncertain stress which would occur during each manufacturing process.

Here, cleavage can readily produce sections along the channel widths or lengths of the N-channel transistors with enhanced ESD resistance and the P-channel MOS transistors with low resistance to current flow.

Also, because of different crystal orientations of the support substrate 1 and the SOI layer 3b, it is possible to make effective use of the feature of the above SOI substrate as having a reduced tendency to break.

FIGS. 23 through 26 show a method of manufacturing the SOI substrate having a strained channel structure according to this preferred embodiment. By way of example, the well-known SMART-CUT (a trademark) technique is employed for bonding of the support substrate 1 and the SOI layer 3b.

Prior to bonding, the silicon germanium layer 31 is formed in the surface of a wafer 320 for the SOI layer by, for example, UHV-CVD (Ultra High Vacuum CVD) (FIG. 23). Then, hydrogen ion implantation IP is performed to a depth corresponding to a thickness DP1 of the silicon germanium layer 31, thereby to form a crystal defect layer DF (FIG. 24).

Figure 25:
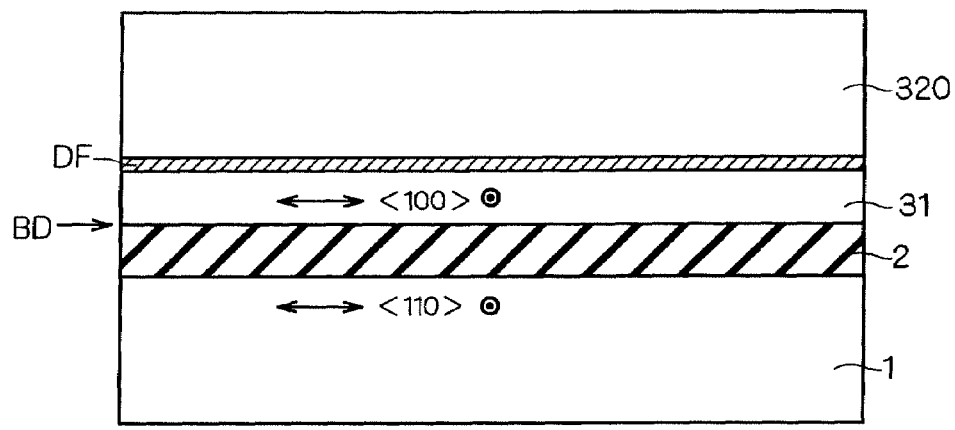

Then, as shown in FIG. 25, the silicon germanium layer 31 in the wafer 320 for the SOI layer is bonded to a major surface of a wafer for the support substrate 1 in the surface of which the oxide film layer 2 is formed. In FIG. 25, the bonding surface is indicated by BD. At this time, the support substrate 1 and the wafer 320 for the SOI layer are bonded with their respective <100> crystal orientations misaligned by 45 degrees with respect to each other.

Figure 26:
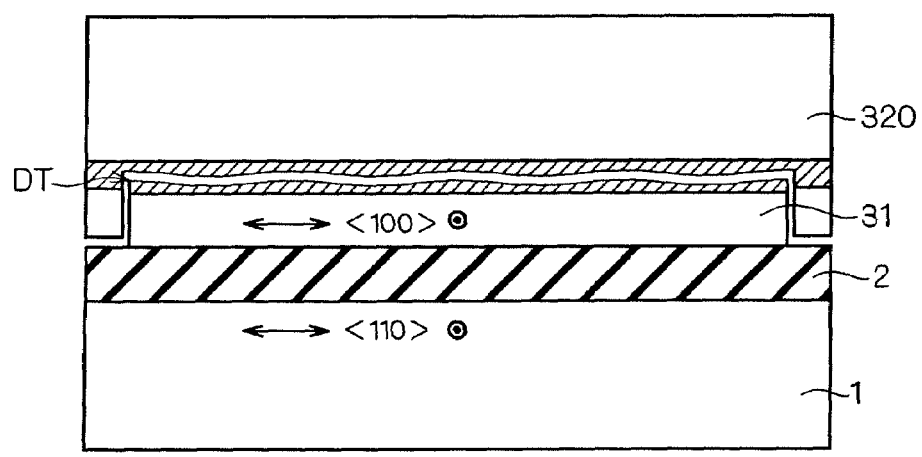

Then, heat treatment is conducted to weaken the crystal defect layer DF and, as shown in FIG. 26, the wafer 320 for the SOI layer is divided at the crystal defect layer DF. At the same time, a peripheral portion of the wafer 320 for the SOI layer which has low adhesion strength is removed. In FIG. 26, a surface of division is indicated by DT.

Under this condition, further heat treatment is conducted to increase bonding strength between the silicon germanium layer 31 and the support substrate 1, and the surface of the silicon germanium layer 31 is lightly polished to remove the remaining crystal defect layer DF.

After that, silicon is, for example, epitaxially grown on the surface of the silicon germanium layer 31 to form the strained silicon channel layer 32 (FIG. 27). Subsequent general manufacturing processes for the N-channel MOS transistor completes the structure shown in FIG. 22.

Seventh Preferred Embodiment

This preferred embodiment provides a semiconductor device in which a SRAM (Static Random Access Memory) is comprised of four MOS transistors formed on an SOI substrate where a <100> crystal direction of the SOI layer is aligned with a <110> crystal direction of a support substrate.

Figure 28:
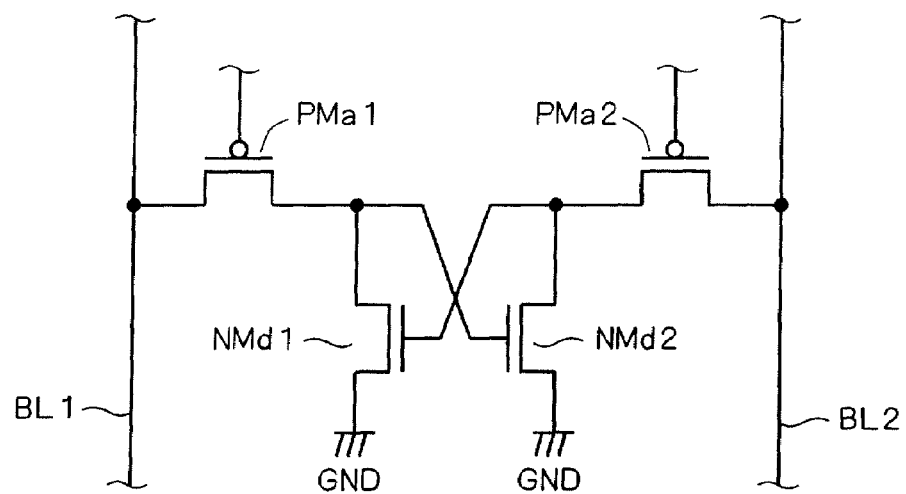
FIG. 28 is a circuit diagram showing a semiconductor device according to a seventh preferred embodiment.

FIG. 28 is a circuit diagram of a semiconductor device according to this preferred embodiment. In this semiconductor device, as shown in FIG. 28, two N-channel MOS transistors NMd1, NMd2 and two P-channel MOS transistors PMa1, PMa2 constitute a SRAM.

More specifically, the drain of the N-channel MOS transistor NMd1 is connected to the gate of the N-channel MOS transistor NMd2, and the drain of the N-channel MOS transistor NMd2 is connected to the gate of the N-channel MOS transistor NMd1.

A ground potential GND is applied to the sources of the N-channel MOS transistors NMd1 and NMd2. The drain of the N-channel MOS transistor NMd1 is also connected to the drain of the P-channel MOS transistor PMa1, and the drain of the N-channel MOS transistor NMd2 is also connected to the drain of the P-channel MOS transistor PMa2. The sources of the P-channel MOS transistors PMa1 and PMa2 are connected respectively to bit lines BL1 and BL2.

Like the N-channel MOS transistor shown in FIGS. 1 to 3, the MOS transistors NMd1, NMd2, PMa1 and PMa2 each are formed on the surface of an SOI substrate where a support substrate such as a silicon substrate, an oxide film layer and an SOI layer such as a silicon layer are stacked in this order. Like the N-channel MOS transistor shown in FIGS. 1 to 3, they each have a gate electrode, a gate insulating film and source/drain active layers. Of the above transistors, the source/drain active layers in the P-channel MOS transistors are, of course, P-type source/drain active layers doped with P-type impurities.

In the SOI substrate, a <100> crystal direction of the SOI layer is aligned with a <110> crystal direction of the support substrate. In any of the MOS transistors NMd1, NMd2, PMa1 and PMa2, a multilayer structure of the gate electrode and the gate insulating film is formed on the surface of the SOI layer, and the source/drain active layers are formed adjacent to the gate electrode in the SOI layer.

Figure 29:
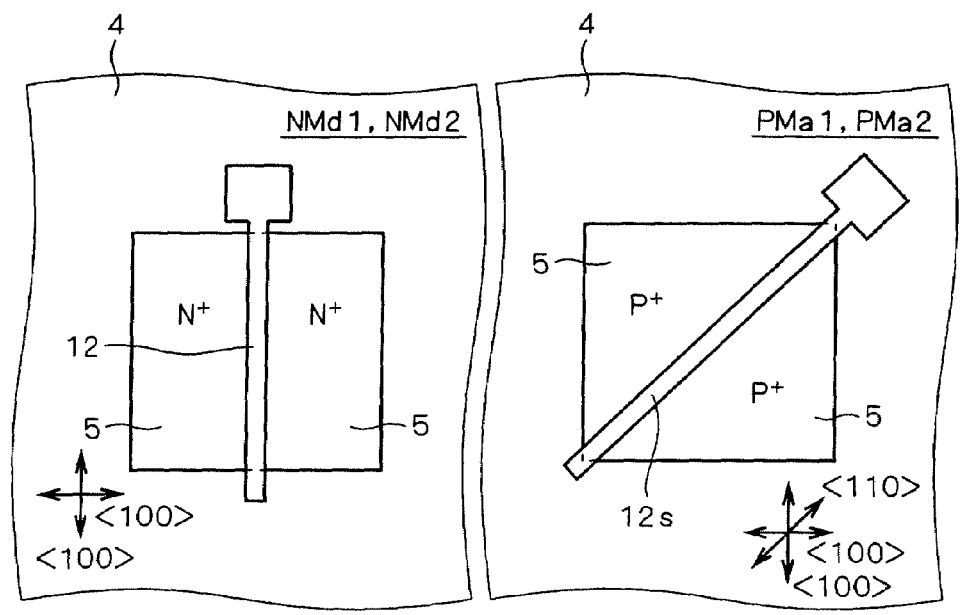
FIG. 29 is a top plan view showing the semiconductor device according to the seventh preferred embodiment.

In the N-channel MOS transistors NMd1 and NMd2, as shown in FIG. 29, the channel directions are aligned parallel to the <100> crystal direction of the SOI layer. That is, a direction of the gate width of the gate electrode 12 which is perpendicular to the channel direction is aligned parallel to the <100> crystal direction of the SOI layer.

In the P-channel MOS transistors PMa1 and PMa2, on the other hand, the channel directions are aligned parallel to the <110> crystal direction of the SOI layer. That is, a direction of the gate width of a gate electrode 12s which is perpendicular to the channel direction is aligned parallel to the <110> crystal direction of the SOI layer.

While the P-type active layer 6 for body voltage application is shown in the N-channel MOS transistor of the first preferred embodiment, the formation of such an active layer for body voltage application is optional for the MOS transistors NMd1, NMd2, PMa1 and PMa2 according to this preferred embodiment.

In the semiconductor device according to this preferred embodiment, the MOS transistors NMd1, NMd2, PMa1 and PMa2 are connected to form a SRAM. Further, the channel directions in the N-channel MOS transistors NMd1 and NMd2 which correspond to driver transistors for storing information in the SRAM are aligned parallel to the <100> crystal direction of the SOI layer. Furthermore, the channel directions in the P-channel MOS transistors PMa1 and PMa2 which correspond to access transistors for controlling the exchange of information in the SRAM are aligned parallel to the <110> crystal direction of the SOI layer.

The channel directions aligned parallel to the <110> crystal direction of the SOI layer in the P-channel MOS transistors PMa1 and PMa2 result in lower carrier mobility in the P-channel MOS transistors PMa1 and PMa2 than the channel directions aligned parallel to the <100> crystal direction of the SOI layer.

Now expressed by the following equation is the ratio $R_{cell}$ of the conductance of the driver transistor to that of the access transistor, which is to be an index indicating stability of information storage in an SRAM memory cell:

$$R_{cell} = \frac{\frac{W_{dr}}{L_{dr}} \cdot \mu_{dr} \cdot P_{dr}}{\frac{W_{ac}}{L_{ac}} \cdot \mu_{ac} \cdot P_{ac}} \quad (1)$$

In Equation (1), $W_{dr}$ is the gate width of the driver transistor; $L_{dr}$ is the gate length of the driver transistor; $\mu_{dr}$ is the carrier mobility of the driver transistor; $P_{dr}$ is the parameter of the conductance of the driver transistor other than the above parameters; $W_{ac}$ is the gate width of the access transistor; $L_{ac}$ is the gate length of the access transistor; $\mu_{ac}$ is the carrier mobility of the access transistor; and $P_{ac}$ is the parameter of the conductance of the access transistor other than the above parameters.

To ensure high stability of information storage in a SRAM memory cell, the conductance ratio $R_{cell}$ should be set equal to or higher than a certain value. When compared with a semiconductor device in which the channel directions in all four MOS transistors are aligned parallel to the <100> crystal direction of the SOI layer, the semiconductor device according to this preferred embodiment can reduce the carrier mobility $\mu_{ac}$ of the access transistor. This means an increase in the conductance ratio $R_{cell}$ in Equation (1) and accordingly an improvement in the stability of SRAM operation.

Now, consider the case where, in the semiconductor device according to this preferred embodiment, the SOI layer is rotated 45 or 135 degrees and a conventional SOI substrate structure is employed in which the <110> crystal direction of the support substrate is aligned with the <110> crystal direction of the support substrate. In this case, the channel directions in the N-channel MOS transistors NMd1 and NMd2 which are driver transistors are aligned parallel to the <110> crystal direction of the SOI layer, and the channel directions in the P-channel MOS transistors PMa1 and PMa2 which are access transistors are aligned parallel to the <100> crystal direction of the SOI layer. In this case, the carrier mobility $\mu_{ac}$ of the access transistors is higher than that in this preferred embodiment and therefore, the conductance ratio $R_{cell}$ cannot be increased.

From the above description, it is seen that the stability of SRAM operation can be achieved by arranging each transistor in the SRAM memory cell as in the semiconductor device according to this preferred embodiment.

Alternatively, if the conductance ratio $R_{cell}$ need only be kept to a predetermined value, the carrier mobility $\mu_{ac}$ of the access transistor can be reduced, by which it is possible to reduce the gate width $W_{dr}$ of the driver transistor and thereby to save space.

Here, cleavage can readily produce a section along the channel width or length of such a MOS transistor with stabilized SRAM operation.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device comprising:
an SOI substrate in which a support substrate, an SOI layer and an oxide film layer formed between said support substrate and said SOI layer, said SOI layer having a semiconductor surface of a first crystal plane, and a <100> crystal direction of said SOI layer is aligned with a <110> crystal direction of the support substrate; and a P-channel MIS transistor including a gate insulating film formed on said semiconductor surface of said SOI layer, a gate electrode extending in a first direction and formed on said gate insulating film, P-type active layers aligned in a second direction which is perpendicular to said first direction and formed at both sides of said gate electrode, and a N-type body layer formed under said gate electrode and between said P-type active layers;

a N-type active layer for body voltage application which is formed on said crystal plan of said SOI layer;

a N-type path portion connecting said N-type body layer and said N-type active layer for body voltage application;

and said second direction is aligned to said <100> crystal direction of said SOI layer;

and said support substrate having a semiconductor surface which is the equal crystal plane as said crystal plane of said SOI layer, and said oxide film is formed on said semiconductor surface of said support substrate;

wherein said first crystal plane is (100) plane, further comprising:

a first insulating film formed between said N-type path portion and said gate electrode, wherein said first insulating film is thicker than said gate insulating film.

2. A semiconductor device according to claim 1, further comprising:

a second insulating film surrounding said P-channel MIS transistor, a P-type active layer and a N-type path portion, wherein said second insulating film is thicker than said first insulating film.

3. A semiconductor device according to claim 2, wherein said second insulating film contacts said oxide film.

4. A semiconductor device comprising:

a SOI substrate in which a support substrate, an SOI layer and an oxide film layer formed between said support substrate and said SOI layer, said SOI layer having a semiconductor surface of a first crystal plane, and a <100> crystal direction of said SOI layer is aligned with a <110> crystal direction of the support substrate; and an P-channel MIS transistor including a first gate insulating film formed on said semiconductor surface of said SOI layer, a gate electrode extending in a first direction and formed on said gate insulating film, P-type active layers aligned in a second direction which is perpendicular to said first direction and formed at both sides of said gate electrode, and a N-type body layer formed under said gate electrode and between said P-type active layers;

an N-channel MIS transistor including a second gate insulating film formed on said semiconductor surface of said SOI layer, a gate electrode extending in a third direction and formed on said gate insulating film, N-type active layers aligned in a fourth direction which is perpendicular to said third direction and formed at both sides of said gate electrode, and a P-type body layer formed under said gate electrode and between said N-type active layers;

and both of said second direction and said fourth direction are aligned to said <100> crystal direction of said SOI layer;

and said support substrate having a semiconductor surface which is the equal crystal plane as said crystal plane of said SOI layer, and said oxide film is formed on said semiconductor surface of said support substrate;

wherein said first crystal plane is (100) plane; further comprising:

a first insulating film formed between said P-type path portion and said gate electrode, wherein said first insulating film is thicker than said gate insulating film.

5. A semiconductor device according to claim 4, further comprising:

a second insulating film surrounding both said P-channel MIS transistor and said N-channel MIS transistor, an active layer and a path portion, wherein said second insulating film is thicker than said first insulating film.

6. A semiconductor device according to claim 5, wherein said second insulating film contacts said oxide film.

* * * * *